(12) United States Patent
Magazz' et al.

(10) Patent No.: US 6,593,817 B1
(45) Date of Patent: Jul. 15, 2003

(54) METHOD AND CIRCUIT FOR MINIMIZING GLITCHES IN PHASE-LOCKED LOOPS

(75) Inventors: Antonio Magazz', Messina (IT); Benedetto Marco Marletta, Aci S. Antonio (IT); Giuseppe Gramegna, Catania (IT); Alessandro D'Aquila, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/553,612

(22) Filed: Apr. 20, 2000

(30) Foreign Application Priority Data

Apr. 21, 1999 (EP) ............................................. 99830234

(51) Int. Cl.$^7$ ................................................ H03L 7/06
(52) U.S. Cl. ........................... 331/17; 331/25; 331/175; 327/157; 327/536
(58) Field of Search ..................... 331/17, 25, 175; 327/536, 157

(56) References Cited

U.S. PATENT DOCUMENTS 4,651,037 A    3/1987  Ogasawara et al.
4,988,902 A    1/1991  Dingwall
6,107,889 A  *  8/2000  Strange et al. ............... 331/17

FOREIGN PATENT DOCUMENTS

WO        WO 98/23035        5/1998

\* cited by examiner

*Primary Examiner*—Arnold Kinkead
(74) *Attorney, Agent, or Firm*—Lisa K. Jorgenson; Robert Iannucci; Seed IP Law Group PLLC (57) ABSTRACT

A method and a circuit for minimizing glitches in phase-locked loops is presented. The circuit includes an input terminal connected to an input of a phase detector; a series of a charge pump generator, a filter and a voltage controlled oscillator connected downstream of the phase detector; and a frequency divider feedback connected between an output of the voltage controlled oscillator and a second input of the phase detector. The circuit provides for the inclusion of a compensation circuit connected between the charge pump generator and the filter to absorb an amount of the charge passed therethrough. This compensation circuit includes a storage element connected in series to two switches. The first switch is coupled to and controlled by an output of the charge pump and the second switch is coupled to and controlled by an output of a phase detector.

14 Claims, 9 Drawing Sheets

METHOD AND CIRCUIT FOR MINIMIZING GLITCHES IN PHASE-LOCKED LOOPS

TECHNICAL FIELD

This invention relates to a method and a circuit for minimizing glitches in phase-locked loops.

BACKGROUND OF THE INVENTION

Figure 1:
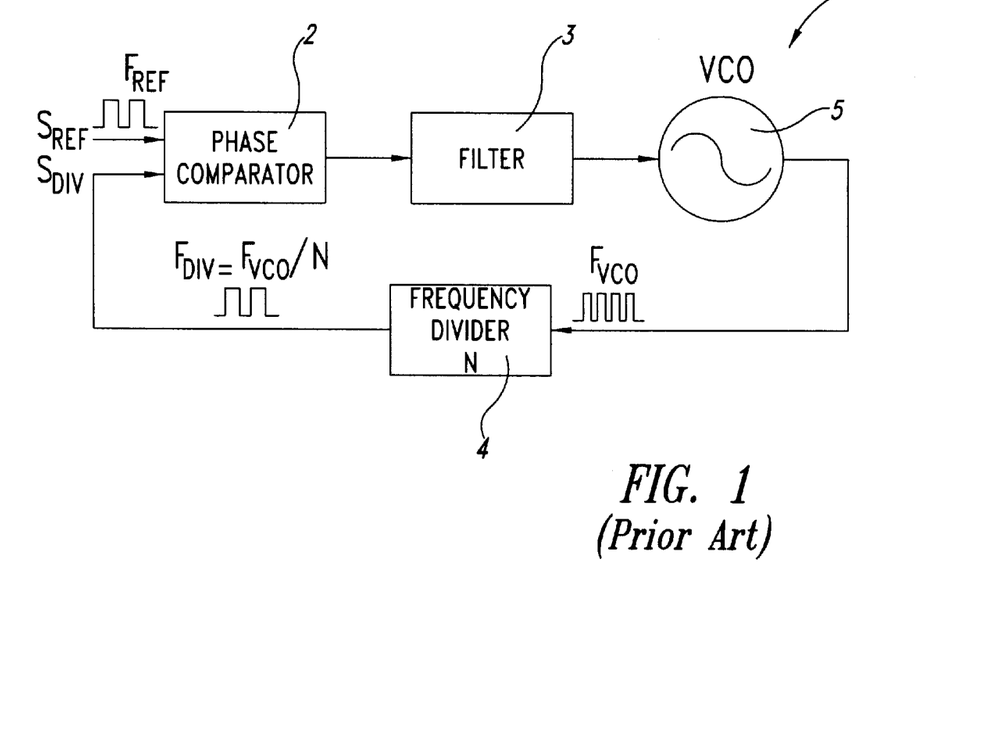
FIG. 1 is a schematic diagram showing a phase lock loop according to the prior art.

A PLL (Phase Lock Loop) as generally shown at 1 in FIG. 1 comprises essentially a phase comparator 2, a filter 3, a frequency divider 4, and a voltage controlled oscillator VCO 5. With the phase lock loop PLL 1 locked to a periodic input signal at a frequency Fref, a frequency Fvco of the voltage controlled oscillator VCO 5 is equal to that of the input signal multiplied by a division ratio N of the frequency divider 4.

The phase comparator 2 then generates a signal which is proportional to the phase difference between the input signal and the output signal of the frequency divider 4. This signal modifies, through the filter 3, the control voltage of the voltage controlled oscillator VCO 5, and consequently its frequency Fvco as well, thereby bringing the output frequency Fdiv of the frequency divider 4 to the same value as the input frequency Fref.

The characteristic parameters according to which a phase lock loop PLL 1 is evaluated are:

accuracy of the generated frequency;

phase noise;

glitch rejection;

locking time; and loop phase margin.

The frequency accuracy of the voltage controlled oscillator VCO 5 is dependent on the frequency accuracy of the input signal and the accuracy of the phase comparator 2. Specifically, it is:

$$\Delta Fvco = N * \Delta Fref + \Delta\Phi/2 * \pi * Fvco \quad (1)$$

where,

ΔFvco is the frequency error of the voltage controlled oscillator VCO 5;

N is the division ratio of the frequency divider 4;

ΔFref is the frequency error of the input signal;

ΔΦ is the phase error of the phase comparator 2; and

Fvco is the output frequency of the voltage controlled oscillator VCO 5.

System specifications covering certain communication standards provide for the largest frequency error of the voltage controlled oscillator VCO 5 to be in the $10^{-8} * Fvco$ range. For example, the GSM Standard sets the maximum error to $2 * 10^{-8} * Fvco$.

In this case, assuming one half of that frequency error to be due to inaccuracy of the input frequency (usually obtained from a crystal oscillator), the maximum acceptable phase error would be $6 * 10^{-8}$ radians.

Such a restricted value for the phase error rules out the use a Gilbert cell for a phase comparator, since this cell exhibits a minimum phase error which lies well above said limit. Furthermore, a Gilbert cell type of phase comparator would exhibit a non-constant system loop gain in the phase locked range of operation.

Figure 2:
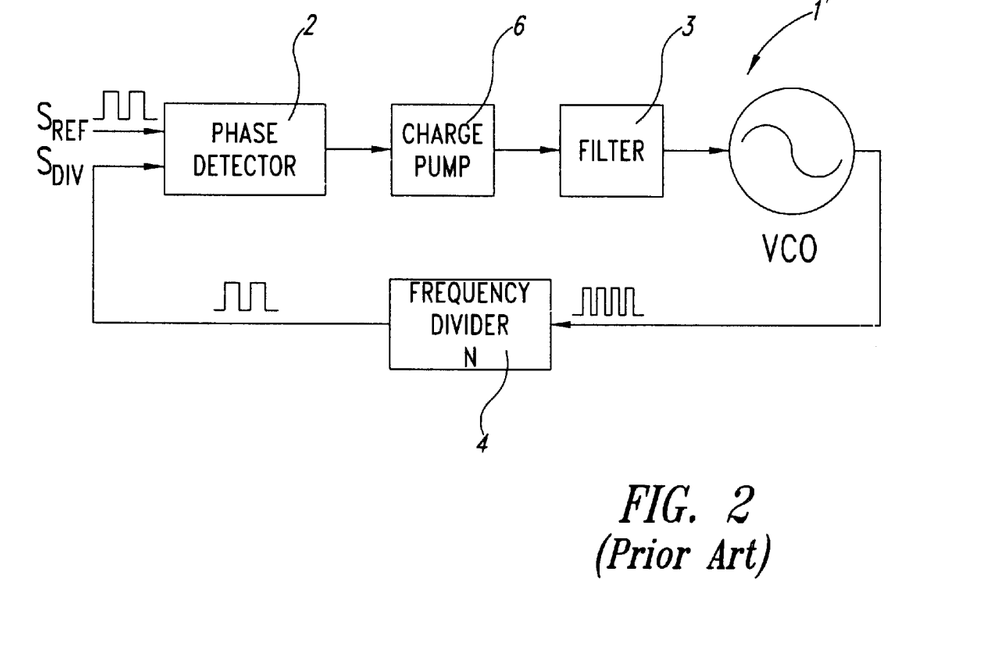
FIG. 2 is a schematic diagram showing a phase lock loop with a charge pump, according to the prior art.

Thus, for standard practical applications, the phase comparator is provided in a charge pump form, using first Icharge and second Idischarge current generators, having the same Icp value and opposite signs, which generators will vary the output control voltage in opposite directions according to whether the output signal of the frequency divider 4 is leading or lagging behind the input signal. A block diagram for a phase lock loop PLL 1' including a charge pump 6, according to the prior art, is shown in FIG. 2.

Figure 3:
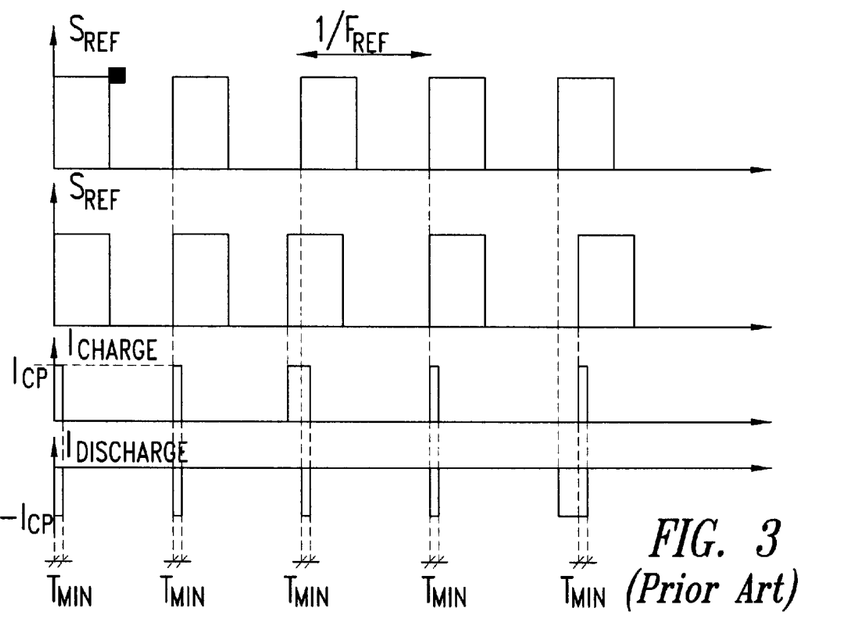
FIG. 3 is a graph showing qualitative patterns of internal signals of the phase lock loop of FIG. 2.

To avoid phase errors and variations in the loop gain of the phase lock loop PLL 1' near the locking range, a time interval Tmin is usually provided when both current generators, Icharge and Idischarge, deliver equal and opposite currents, such that the input voltage to the filter 3 will remain unchanged, as shown in FIG. 3. Thus, the current generators Icharge, Idischarge are turned on at each cycle to ensure that the frequency of the voltage controlled oscillator VCO 5 remains locked to the value N*Fref.

Figure 4:
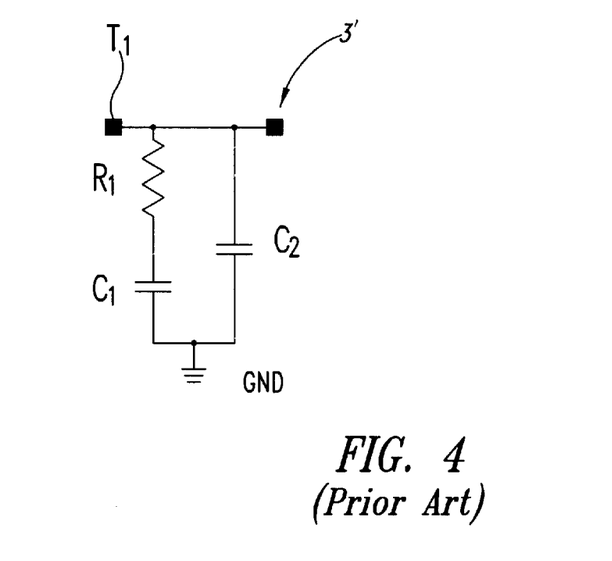
FIG. 4 is a schematic diagram showing a detail of the phase lock loop of FIG. 2.

The use of a filter 3' with two-poles and a zero, as schematically illustrated in FIG. 4, is conceivable. This filter 3' comprises a resistive element R1 connected in series to a first capacitive element C1, between a terminal T1 and a voltage reference such as a ground GND. The filter 3' also comprises a second capacitive element C2, connected between said terminal T1 and ground, in parallel with said resistive element R1 and said first capacitive element C1.

The settling time is dependent on the overall loop gain, its phase margin, the filter size, and the maximum admissible frequency error.

Using the filter 3', it is readily seen that the proportionality of the settling time Ts is:

$$Ts \propto \frac{N * R1 * C1}{Icp * Ko} * \ln\left(\frac{B}{\Delta F \max}\right) \quad (2)$$

where,

N is the division ratio;

R1, C1 are elements of the filter 3';

Icp is the charge pump 6 current;

Ko is the oscillator VCO 5 gain;

B is the channel jump of the oscillator VCO 5;

ΔFmax is the maximum frequency error of the oscillator VCO 5.

Formula (2) shows that to obtain short settling times, as is normally required, in wide band, small frequency error systems, it is necessary to use very high values for the charge pump 6 current and filters having decidedly small time constants.

Reasonable values for conventional systems of the GSM and DCS types are:

Icp=4 mA, and t=25 μs.

Thus, by suitable dimensioning of the filter and the charge pump, a phase lock loop PLL could be provided with a settling time value according to specification. However, such dimensioning would be at variance with the specified rejection of glitches at frequencies that are multiples of the reference frequency Fref of the phase lock loop PLL 1.

Figure 5:
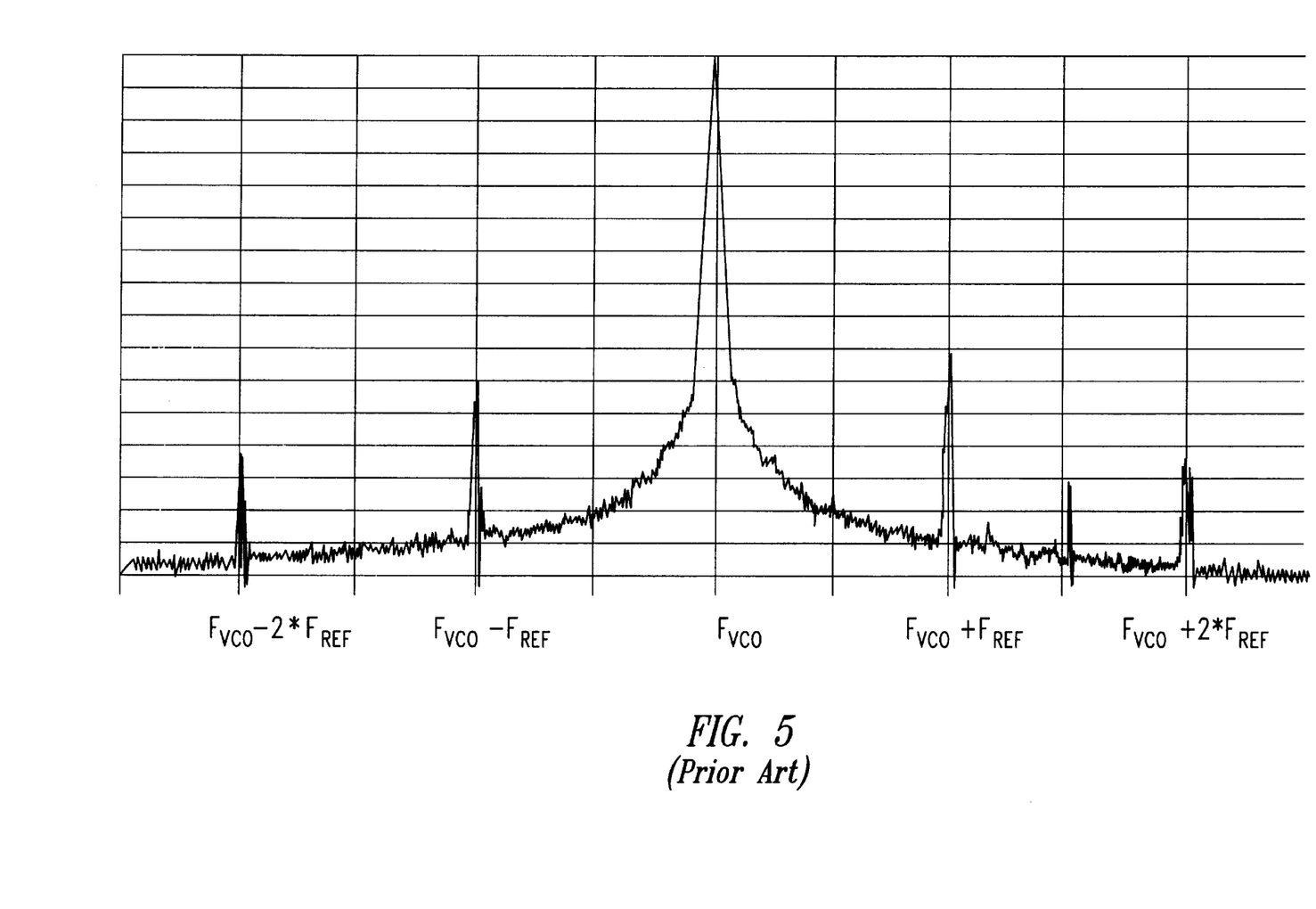
FIG. 5 is a graph showing the frequency spectrum of a VCO incorporated to the phase lock loop of FIG. 2.

In fact, a real phase look loop PLL 1 would exhibit, as a result of process tolerances, a non-pure frequency spectrum, like that shown in FIG. 5.

In particular, the two most evident glitches locate a distance equal to the reference frequency Fref away from the lock frequency Fvco of the voltage controlled oscillator VCO 5. Other glitches, located farther from the oscillation frequency Fvco, are filtered and reduced to a large extent.

It should be noted that glitches are mainly due to two different phenomena, namely the leakage current of the VCO control terminal and a dissymmetry between the two generators of the charge pump.

In particular, the leakage current of the VCO control node is the sum of the leakage currents of the charge pump and the VCO. The contribution from the latter is generally dominant because, at the frequencies of interest, the VCO would essentially consist of an LC resonator, wherein the frequency variation is obtained by varying the voltage across a junction capacitance which has a fairly large leakage current.

The overall leakage current causes the control voltage of the VCO to change proportionally to that current, even with the VCO in the locked state, during the "off" period of the current generators of the charge pump. Consequently, at each cycle, the charge pump is to balance the amount of charge lost during the "off" period.

Thus, the control voltage waveform shows a periodic trend with a period 1/Fref, and this periodic signal generates glitches at frequencies that are multiples of the reference frequency Fref. It can be seen, therefore, that the amplitude of such glitches is directly proportional to the leakage current and inversely proportional to the value of the second capacitive element C2 of the filter 3'.

As a result, in transmission systems designed to strict specifications as to settling time and glitches, this contribution to the overall glitch requires that VCOs with very low associated leakage values be used. There are VCOs commercially available which meet both specifications for conventional transmission systems.

The generation of glitches is also due to asymmetry of the two generators of the charge pump. Particularly in the locked condition, in order to prevent the frequency of the VCO from varying, the average voltage value at the control node must be kept constant. The amounts of charge supplied by the two current generators must, therefore, be equal and opposite.

Assuming that in the locked condition one of the generators is delivering a current Icp for a time interval Tmin, and that the current error is ΔIcp between the two generators, advantageously, the second generator would deliver a current Icp+ΔIcp for a time interval equal to Tmin−ΔTmin, to satisfy the following relation:

$$Icp*Tmin=(Icp+\Delta Icp)*(Tmin-\Delta Tmin) \quad (3)$$

Figure 6:
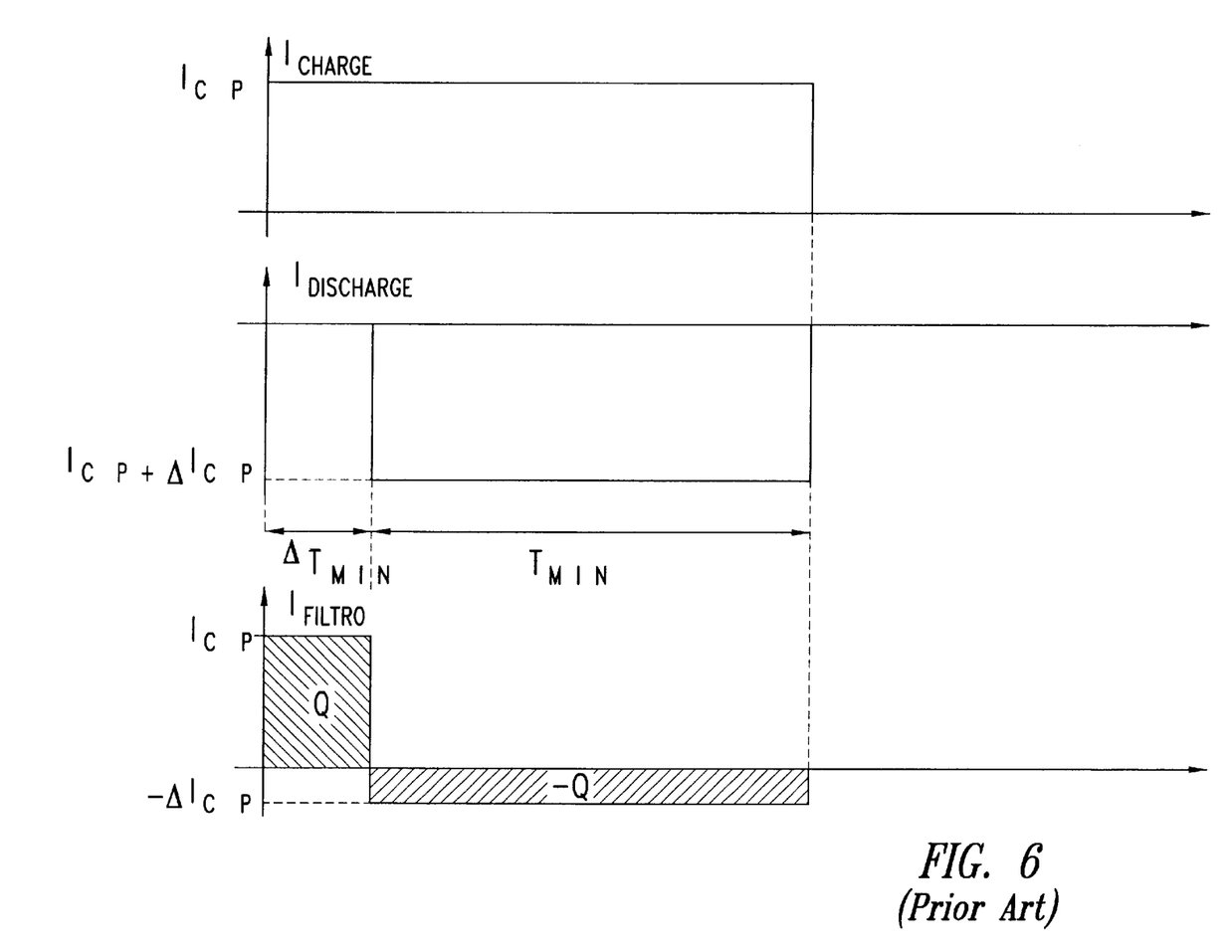
FIG. 6 is a graph showing qualitative patterns of further internal signals of the phase lock loop of FIG. 2.

Illustrated by way of example in FIG. 6 are waveforms representing the currents generated by the two current generators of the charge pump, as well as the difference between the two currents, equal to the current Ifiltro at the filter 3 in the locked condition.

In particular, it should be noted that the total amount of charge supplied to the filter 3 is zero, it being given as the difference of two identical values.

This current Ifiltro generates a periodic variation in the filter voltage, in turn generating glitches at frequencies that are multiples of the reference frequency Fref. These glitches are directly proportional to the asymmetry of the current generators, ΔIcp, and the value of the "on" period Tmin of the generators, and are inversely proportional to the filter capacitance C2.

The contribution to the generation of glitches from the asymmetry of the current generators in applications for which strict settling time specifications are provided, is an order of magnitude larger than the contribution from leakage.

Therefore, the requirements for settling time values and glitch generation are difficult to meet simultaneously, especially in transmission systems designed to strict specifications. In fact, whereas to obtain limited durations of the settling time a large charge current Icp must be used for the charge pump along with a very small filter capacitance C2, the error percent between the current generators, and the respective turn-on times, should be quite small.

Conventional circuit designs, and technological limitations setting a minimum turn-on time for a current generator, make meeting the specifications very difficult.

SUMMARY OF THE INVENTION

Embodiments of this invention provide a phase lock loop which can minimize the generation of glitches and overcome the limitations of prior art circuits so as to meet, for example, the specifications established for transmission systems.

These embodiments avoid direct connection of the charge pump to the filter, thereby suppressing the glitch due to asymmetry between the current generators of the phase comparator.

Specifically, the invention relates to a circuit for minimizing glitches in phase-locked loops, of the type having an input terminal connected to an input of a phase detector; a series of a charge pump generator, a filter and a voltage controlled oscillator connected downstream of the phase detector; and a frequency divider feedback connected between an output of the voltage controlled oscillator and a second input of the phase detector. In one embodiment, a compensation circuit is placed between the charge pump generator and the filter.

The features and advantages of the device and the method according to the invention will become apparent from the following description of an embodiment thereof, given by way of non-limitative example with reference to the accompanying drawings.

DETAILED DESCRIPTION OF THE INVENTION

Figure 7:
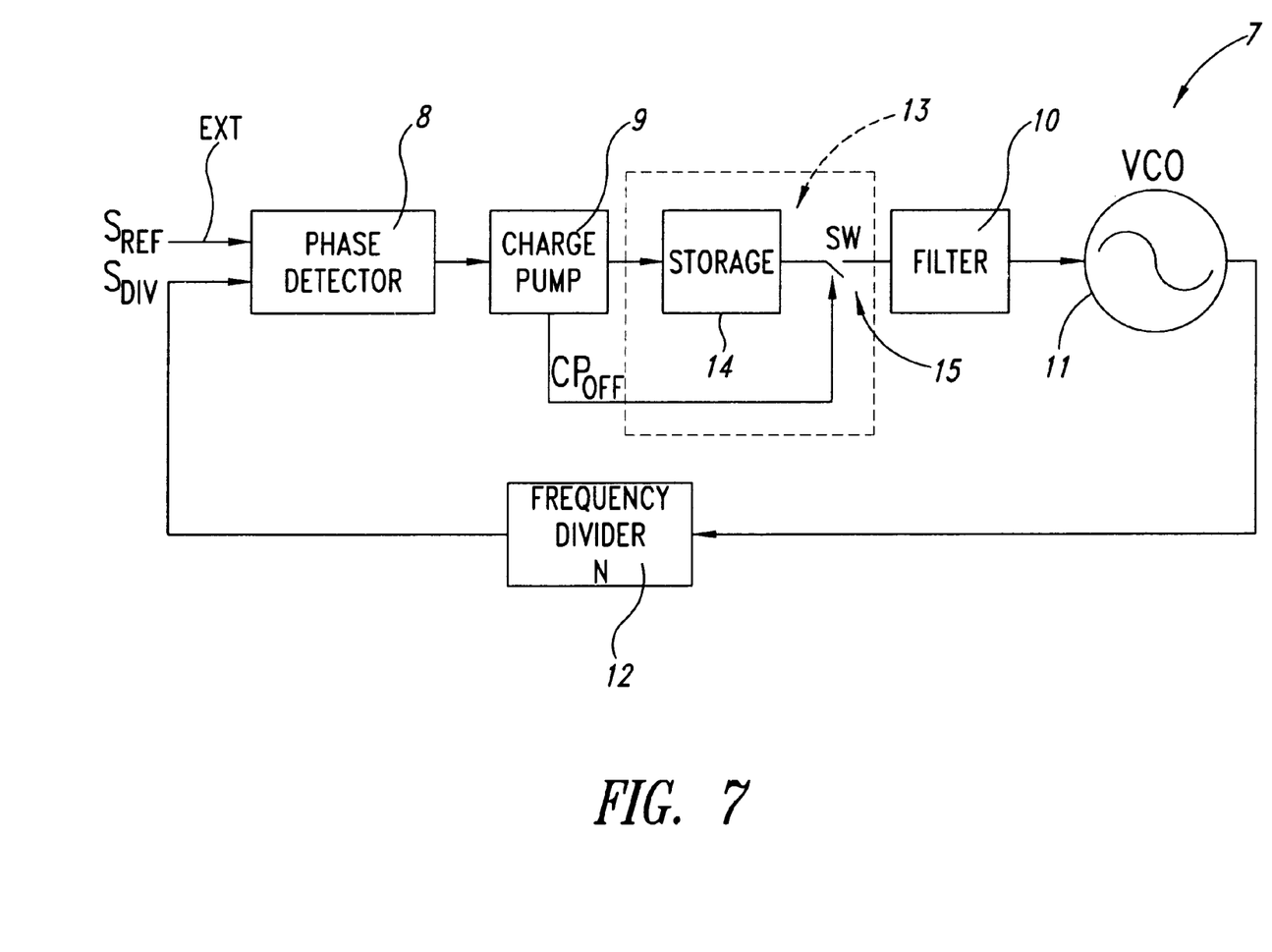
FIG. 7 is a schematic diagram showing a phase lock loop with a charge pump, according to an embodiment of the invention.

Referring to the drawing views, the numeral 7 generally denotes a phase lock loop with a charge pump according to embodiments of this invention, shown in schematic form.

Similar to the loop 1 described above in connection with the prior art, the loop 7 has a terminal EXT that receives an external reference signal Sref and is connected to the input of a phase detector 8. The phase detector 8 is further connected to a series of a charge pump generator 9, a filter 10, and a voltage controlled oscillator VCO 11.

The oscillator VCO 11 is also fed back to the input of the phase detector 8 through a frequency divider 12.

Advantageously in this embodiment, the loop 7 further includes a compensation circuit 13 connected between the charge pump generator 9 and the filter 10. In particular, the compensation circuit 13 includes a storage element 14 connected in series with a controlled switch 15. The switch 15 is controlled by a control signal Cpoff coming from the charge pump generator 9.

The operation of the loop 7 according to this embodiment will now be described.

The switch 15 is controlled to open during the power-on of the current generators incorporated in the charge pump generator 9. Thus, in the locked condition and in the presence of dissymmetry between said current generators, a filter current If will be flowing through the storage element 14, allowing an amount of charge to build up in this element.

Actually, at the end of the conduction period of the generators inside the charge pump generator 9, the charge built-up in the storage element 14 will be nil, as shown in FIG. 6 already discussed in connection with the prior art.

Thus, the provision of a compensation circuit 13 is effective to suppress the contribution from glitches appearing in the loop 7.

Advantageously in this embodiment, the compensation circuit 13, with its mechanism of charge build-up in the storage element 14, will absorb the amount of charge passed through the charge pump generator 9. In this way, any leakages from the generator or charge build-ups due to dissymetries on its inside are accommodated.

Figure 8:
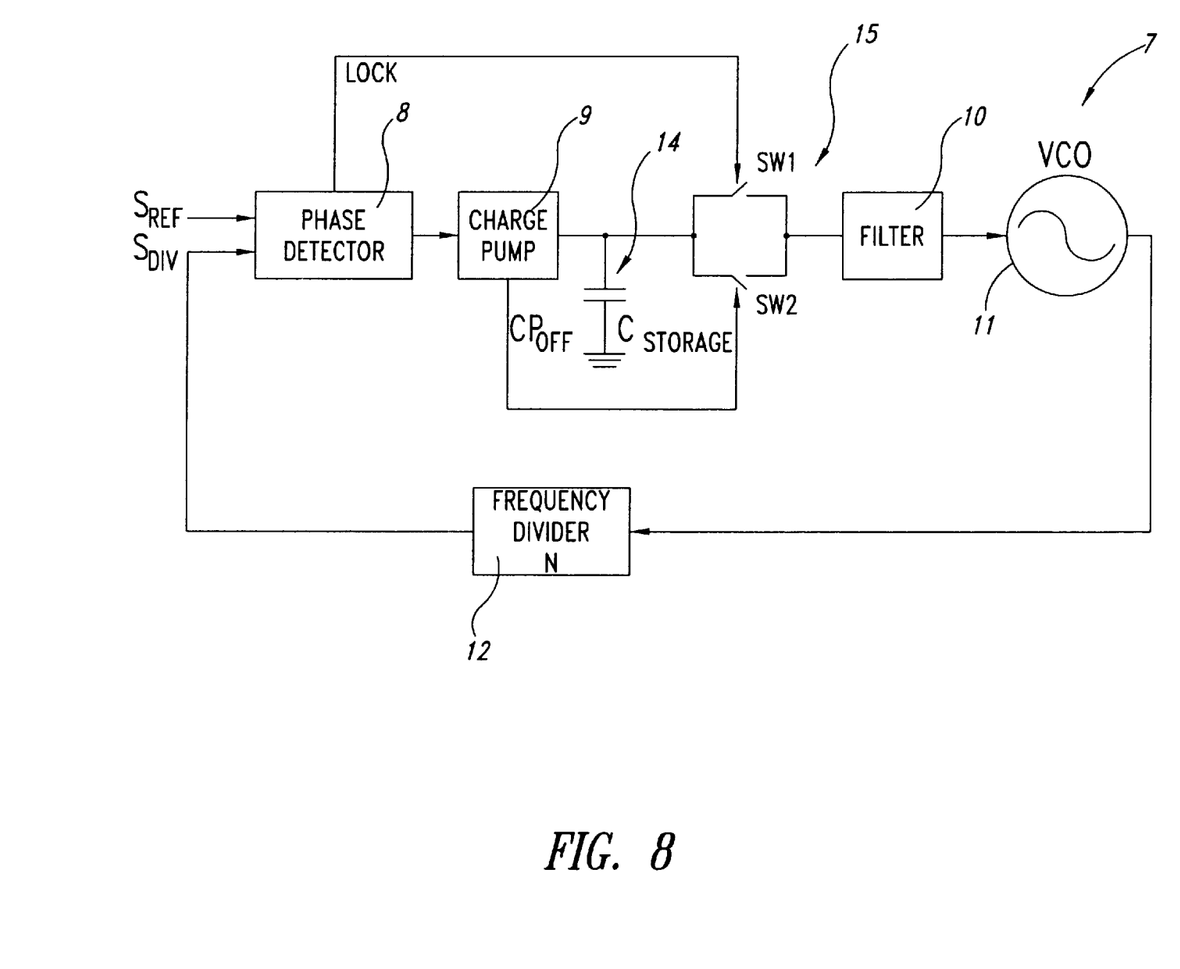
FIG. 8 is a schematic diagram showing a first embodiment of the phase lock loop of FIG. 7.

Shown in FIG. 8 is a first embodiment of the loop 7 of FIG. 7. In particular, the storage element 14 comprises essentially a capacitor Cstorage connected between the output of the charge pump generator 9 and a voltage reference, such as a ground GND.

The capacitor Cstorage should be of limited capacitance not to affect the transfer function of the loop 7 as a whole. This implies a limited capability of the capacitor Cstorage of storing charge.

In particular, outside the locked condition of the loop 7, the turning on of one of the two current generators in the charge pump generator 9, being proportional to the difference between the reference signal Sref and a feedback signal Sdiv supplied to the input of the phase detector 8 from the frequency divider 12, will generate too large an amount of charge for storing in the capacitor Cstorage.

To obviate this potential drawback, a second circuit portion can be added to the capacitor Cstorage as shown in FIG. 8. Advantageously in this modification, the switch 15 comprises first SW1 and second SW2 elementary switches, connected in parallel with each other between the charge pump generator 9 and the filter 10 and respectively controlled by a signal LOCK from the phase detector 8 and a signal Cpoff from the charge pump generator 9.

In particular, the first elementary switch SW1, controlled by the signal LOCK, closes when the loop 7 is not in a locked condition and opens when the phase difference between the signals Sref and Sdiv is smaller than a predetermined threshold value. The second elementary switch SW2, controlled by the signal Cpoff, opens before the turning on of the charge pump generator 9 and closes after this is turned off.

The switches and capacitors can be integrated simultaneously by present manufacturing techniques. There remains to be integrated the filter 10.

The phase lock loop 7 of this embodiment will, when produced in an integrated circuit therefore, have the same number of pins and non-integratable components as a conventional loop.

In addition, the pair of elementary switches, SW1 and SW2, are effective to retain the low resistance specifications outside the locked condition, by the switch SW1 having a small equivalent resistance and reduced capacitance in the other conditions, and the switch SW2 comprising small-size transistors, in particular smaller than those used in switch SW1.

It should be noted that the parasitic capacitances associated with the elementary switches SW1 and SW2 will cause charge to pass between the capacitor Cstorage and the filter even in the locked condition and absence of a leakage current, specifically upon the elementary switches changing of state.

This passage of charge through the second elementary switch SW2 generates glitches, because of its disturbing effect on the state of the control node of the oscillator VCO 11.

The passage of charge through the first elementary switch SW1 produces a variation in the control voltage of the oscillator VCO 11, which may result in a shift of the locked condition.

Accordingly, it will be expedient to minimize this charge passage inside the elementary switches SW1 and SW2 by designing them for compensation of charge upon changeover.

Figure 9:
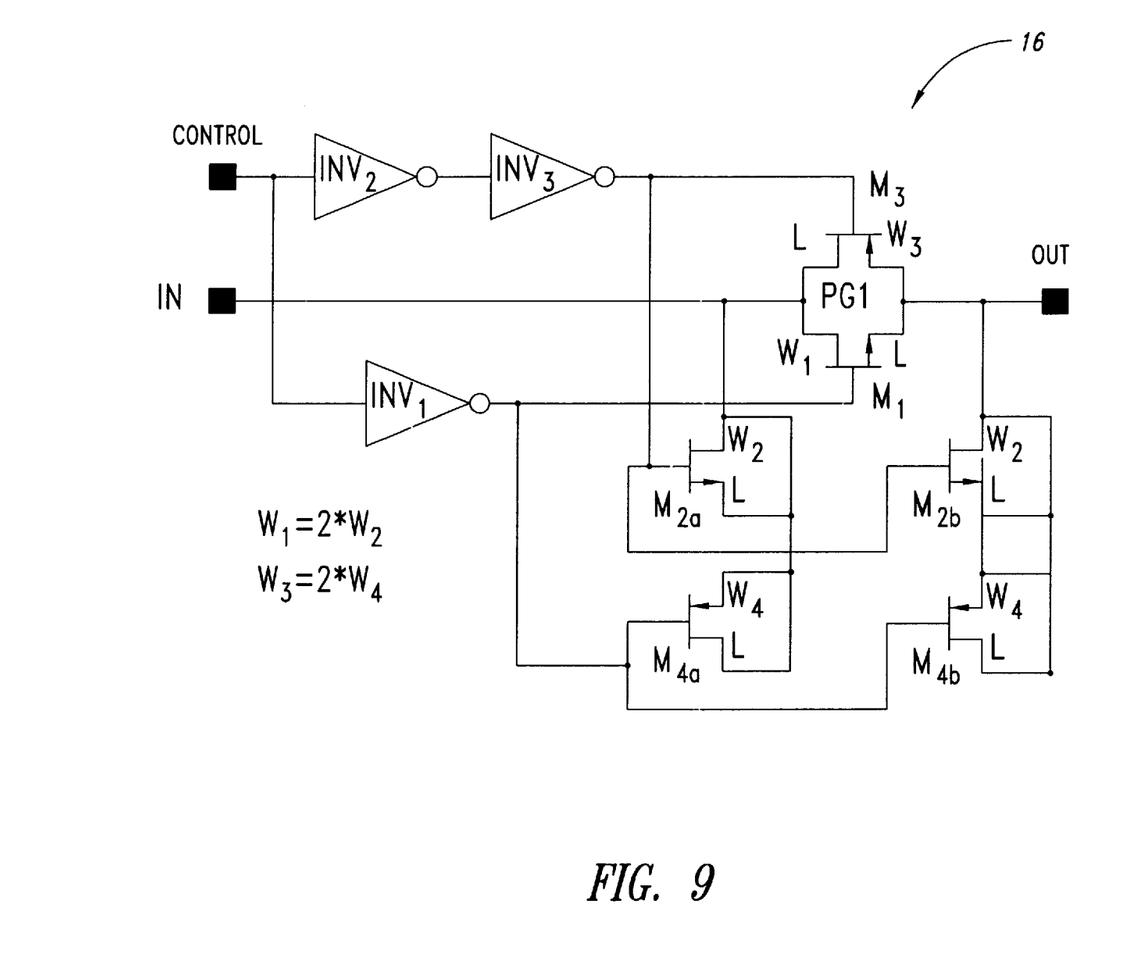
FIG. 9 is a schematic diagram showing a detail of the phase lock loop of FIG. 7.

A possible circuit embodiment of a compensated elementary switch 16 is shown in FIG. 9.

The switch 16 has an input terminal IN, an output terminal OUT, and a control terminal CONTROL. In particular, the control terminal of the first elementary switch SW1 receives the signal LOCK (FIG. 8), and the control terminal of the second elementary switch SW2 receives the signal Cpoff (FIG. 8), their respective input terminals being connected to the charge pump generator 9 and their respective output terminals being connected to the filter 10.

The switch 16 of FIG. 9 includes a pass-gate PG1 which is connected between the input terminal IN and the output terminal OUT and consists of a first NMOS transistor M1 and a second PMOS transistor M3 whose control terminals are coupled to the control terminal CONTROL.

In particular, the control terminal of the first transistor M1 is connected to the control terminal CONTROL through a first inverter INV1, and the control terminal of the second transistor M3 is connected to the control terminal CONTROL through a series of second INV2 and third INV3 inverters. Thus, the transistors M1 and M3 of the pass-gate PG1 are driven in phase opposition, thereby ensuring compatibility of the switch 16 input with connection to both a ground reference and a supply terminal.

The switch 16 further comprises first M2$a$ and second M2$b$ NMOS compensation transistors having their source and drain terminals shorted together and connected to the input IN and output OUT terminals of the switch 16. The compensation transistors M2$a$ and M2$b$ also have their control terminals connected together and to the control terminal CONTROL of the switch 16 through the series of the inverters INV2 and INV3.

The transistors M2a and M2b are thus driven in phase opposition to the transistor M1.

Finally, the switch 16 comprises third M4a and fourth M4b PMOS compensation transistors which have their source and drain terminals shorted together and connected to the common source and drain terminals of the transistors M2a and M2b and to the input IN and output OUT terminals of the switch 16, respectively. Furthermore, the compensation transistors M4a and M4b have their control terminals connected together and to the input terminal IN of the switch 16 through the inverter INV1.

Similar as the transistors M2a and M2b, the transistors M4a and M4b are driven in phase opposition to the transistor M3.

Advantageously in this embodiment, the size of the compensation transistors (M2a, M2b, M4a, M4b) is chosen equal to one half the size of the transistors of the pass-gate PG1.

How this choice reflects in advantageous features of the inventive device will now be explained.

In the locked condition, the voltage at the input terminal IN is approximately equal to the voltage at the output terminal OUT. The gate-drain and gate-source capacitances of the first transistor M1 are, therefore, identical.

With the transistor arrangement of this embodiment, the compensation transistors M2a and M2b have the same gate-source and gate-drain voltages as the first transistor M1 of the pass-gate PG1. The paralleled gate-source and gate-drain capacitances of these compensation transistors with halved dimensions are equal to the corresponding capacitances of transistor M1.

In this condition, as the control terminal CONTROL changes its state, the gate nodes of the transistors M2a and M2b move in opposite directions to the gate node of the transistor M1, and the amount of charge injected thereby into the terminals IN and OUT is equal and opposite to the amount of charge injected by the gate-source and gate-drain capacitances of transistor M1. The compensation of transistor M3 by transistors M4a and M4b is effected in a like manner.

By using a filter as described in relation to FIG. 9, a disturbance can be obtained which is by a few orders of magnitude less than the disturbance produced by the generator dissymmetry within the charge pump generator.

Figures 10A, 10B, 10C:
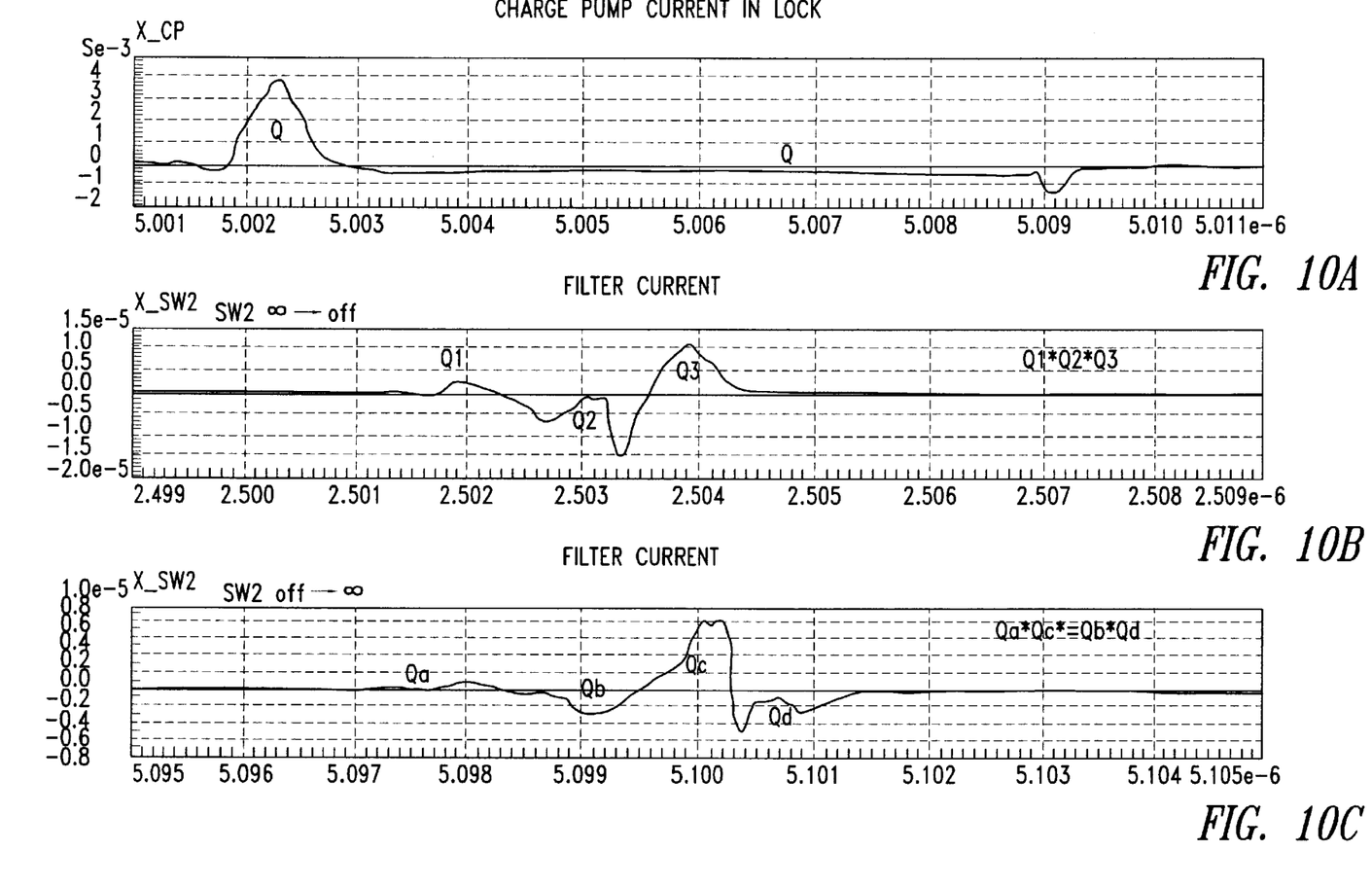
FIGS. 10a, 10b and 10c are graphs showing qualitative patterns of internal signals of the phase lock loops of FIG. 2 and FIG. 7.

FIG. 10 shows comparative graphs illustrating the improved performance brought about by the phase lock loop of an embodiment of this invention compared with a prior art loop.

In particular, FIG. 10(a) shows the evolution of currentin a prior art loop; FIGS. 10(b) and 10(c) show the evolution of the current through the switch during the on and off transitions respectively according to a tested embodiment of the invention.

It can be seen that the amount of charge injected into the filter upon the switch in the loop of this embodiment opening and closing is 100 times less than in prior solutions.

An additional advantage of the phase compensation loop according to this embodiment is that the glitches originated by the leakage current of the charge pump generator 9 are halved.

In applications where glitches are to be specially small, prior art arrangements were obliged to use VCOs with minimal leakage currents, as previously pointed out. In this condition, the leakage current of the VCO takes the same order of magnitude as the leakage current of the charge pump generator, thereby playing an important role as regards compliance with design specifications.

The phase compensation loop of this embodiments of the invention allows the contribution from the leakage current of the charge pump generator to be cut down by one half through a modification of its operating principle. Particularly in the loop, the second elementary switch SW2 is controlled to open with a half-period delay from its close, thereby halving the filter voltage discharge due to the leakage current of the charge pump generator.

Figure 11:
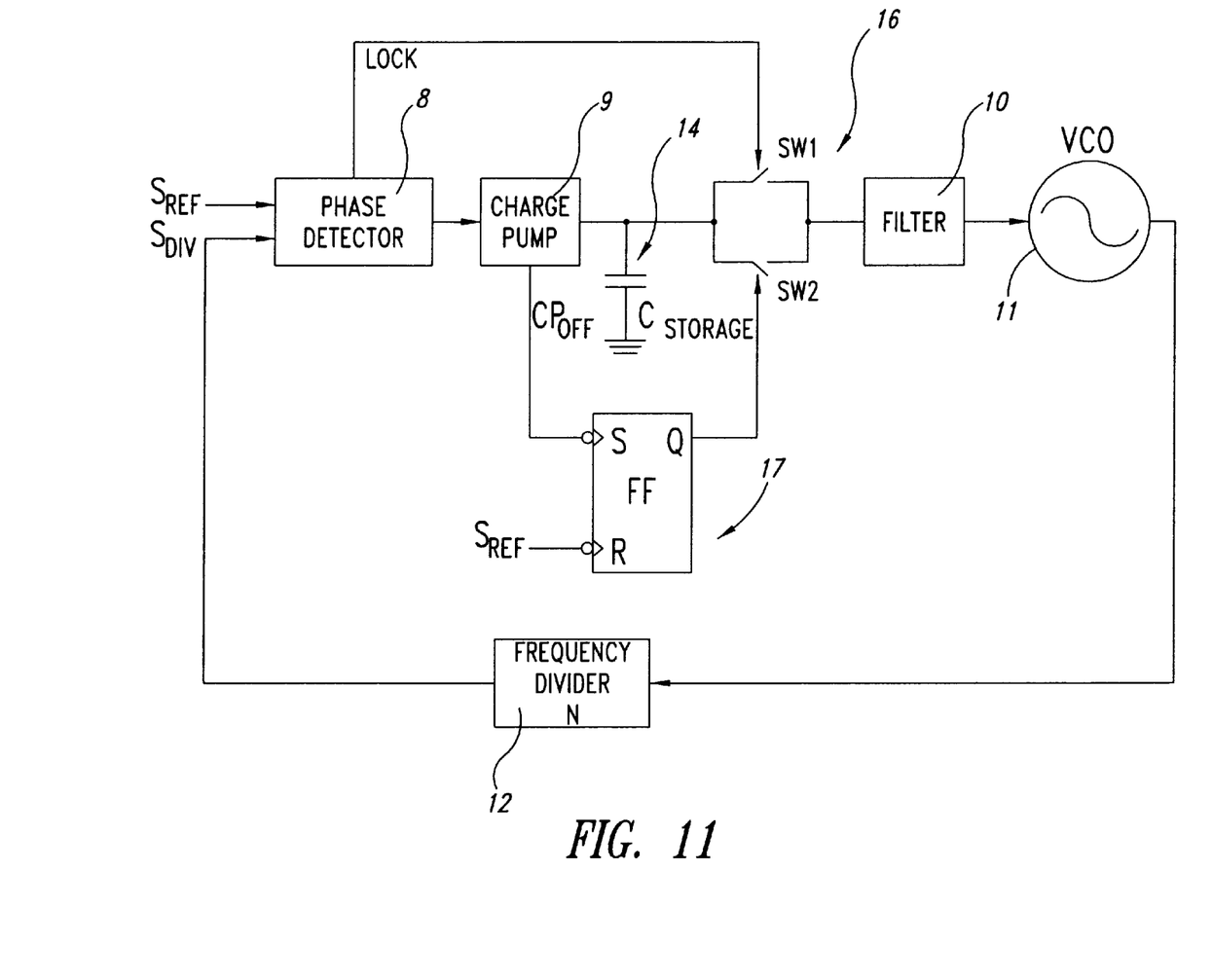
FIG. 11 is a schematic diagram showing a second embodiment of the phase lock loop of FIG. 7.

This modification can be acquired to the operating principle of the charge pump generator by using a flip-flop 17 of the set/reset type connected to a control terminal of said generator, as shown schematically in FIG. 11.

In particular, the flip-flop 17 would be set by the turn-off signal of both internal generators of the charge pump generator 9, and reset by the trailing edge of the reference signal Sref.

It should be considered that, to arrive at the embodiment shown in FIG. 11, the phase detector 8 has been assumed to compare the signals at the raising edges, and the duty cycle of the reference signal Sref assumed to be 50%.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A circuit for minimizing glitches in a phase-locked loop circuit comprising:

a circuit input terminal;

a phase detector having a first input and a second input, the first input coupled to the circuit input terminal;

a charge pump generator coupled to the phase detector, the charge pump generator including a first and second output terminals;

a signal filter coupled to the charge pump generator, the signal filter having an output;

a voltage controlled oscillator having an input coupled to the output of the signal filter, and having an output terminal;

a frequency divider coupled in feedback between the output terminal of the voltage controlled oscillator and the second input of the phase detector; and a compensation circuit connected between the first output terminal of the charge pump generator and the signal filter and structured to absorb an amount of the charge passed therethrough, the compensation circuit including a first switch having a first conduction terminal coupled to the first output terminal of the charge pump generator, a second conduction terminal coupled to the signal filter, and a control terminal coupled to the second output terminal of the charge pump generator such that the first switch couples the charge pump generator to the signal filter based on a control signal received from the second output terminal of the charge pump generator.

2. The circuit according to claim 1, wherein the compensation circuit comprises a storage element coupled to the first conduction terminal of the first switch.

3. The circuit according to claim 1, wherein the charge pump generator comprises a current generator, and wherein the first switch is open during a turn-on phase of the current generator.

4. The circuit according to claim 2, wherein the storage element comprises a capacitor connected between one of the output terminals of the charge pump generator and a voltage reference.

5. The circuit according to claim 2, wherein the compensation circuit comprises a second switch connected in parallel between one of the output terminals of the charge pump generator and the signal filter.

6. The circuit according to claim 5, wherein the second switch is controlled by a signal from the phase detector.

7. The circuit according to claim 6, wherein the first switch is closed when the phase-locked loop circuit is in a non-locked phase condition.

8. The circuit according to claim 5, wherein each of the first and second switches is a compensated type and has an input terminal, an output terminal, and a control terminal, and wherein a pass-gate is connected between the input terminal and the output terminal of each switch, wherein the pass-gate comprises:

a NMOS transistor and a PMOS transistor having respective control terminals coupled to the phase detector; and wherein the circuit further includes a first pair of compensation transistors driven in phase opposition to the NMOS transistor, and a second pair of compensation transistors driven in phase opposition to the PMOS transistor.

9. A phase-locked loop circuit comprising:

a charge pump generator including first and second output terminals;

a signal filter; and a compensation circuit connected between the first output terminal of the charge pump generator and the signal filter, the compensation circuit including a charge storage element and a first controlled switch having a control terminal coupled to the second output terminal of the charge pump generator, such that the compensation circuit is structured to absorb an amount of the charge passed therethrough wherein a first terminal of the charge storage element is coupled to the first output terminal of the charge pump generator and wherein a second terminal of the charge storage element is coupled to a reference voltage.

10. The phase-locked loop circuit of claim 9 wherein the charge pump generator is structured to generate a control signal on the second output terminal when the charge pump generator is operating.

11. The phase-locked loop circuit of claim 9 wherein the first controlled switch is coupled between the first terminal of the charge storage element and the signal filter.

12. The phase-locked loop circuit of claim 11 further comprising:

a phase detector coupled to the charge pump generator and having a signal terminal; and a second controlled switch coupled in parallel to the first controlled switch, the second controlled switch including a control terminal coupled to the signal terminal of the phase detector.

13. The phase locked loop circuit of claim 12 wherein the phase detector is structured to generate a signal on its signal terminal when the phase-locked loop circuit is operating within a threshold of being in phase.

14. The phase locked loop circuit of claim 12 wherein the first controlled switch and the second controlled switch are compensated switches.

* * * * *

UNITED STATES PATENT AND TRADEMARK OFFICE
CERTIFICATE OF CORRECTION

PATENT NO. : 6,593,817 B1
DATED : July 15, 2003
INVENTOR(S) : Antonio Magazzu' et al.

It is certified that error appears in the above-identified patent and that said Letters Patent is hereby corrected as shown below:

Title page,
Item [12], "Magazz' et al." should reas as -- Magazzu' et al. --.
Item [75], "Antonio Magazz'" should read as -- Antonio Magazzu' --.

Column 10,
Line 32, "first controlled switch" should read as -- controlled switch --.

Signed and Sealed this

Eighteenth Day of November, 2003

JAMES E. ROGAN
*Director of the United States Patent and Trademark Office*